United States Patent
Böttcher

(10) Patent No.: US 11,041,924 B2
(45) Date of Patent: Jun. 22, 2021

(54) SHIM-DEPENDENT SPOILER GRADIENTS

(71) Applicant: Siemens Healthcare GmbH, Erlangen (DE)

(72) Inventor: Uwe Böttcher, Uttenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/887,662

(22) Filed: May 29, 2020

(65) Prior Publication Data

US 2020/0379069 A1 Dec. 3, 2020

(30) Foreign Application Priority Data

May 29, 2019 (DE) .......................... 102019207907.5

(51) Int. Cl.
*G01R 33/3875* (2006.01)
*G01R 33/54* (2006.01)

(52) U.S. Cl.
CPC ....... *G01R 33/3875* (2013.01); *G01R 33/543* (2013.01)

(58) Field of Classification Search
CPC .............. G01R 33/3875; G01R 33/543; G01R 33/385; G01R 33/56563; G01R 33/485; G01R 33/4838
See application file for complete search history.

(56) References Cited

U.S. PATENT DOCUMENTS 5,345,178 A * 9/1994 Manabe ............... G01R 33/385
324/319
6,545,476 B1 * 4/2003 Heid .................. G01R 33/3875
324/309

OTHER PUBLICATIONS

German Decision to Grant for German Application No. 10 2019 207 907.5 dated Apr. 14, 2020, with English translation.
German Office Action for German Application No. 10 2019 207 907.5 dated Mar. 23, 2020, with English translation.
Starck, G., et al. "k-space analysis of point-resolved spectroscopy (PRESS) with regard to spurious echoes in in vivo 1H MRS." NMR in Biomedicine: An International Journal Devoted to the Development and Application of Magnetic Resonance In vivo 22.2 (2009): 137-147.

* cited by examiner

*Primary Examiner* — Rishi R Patel
(74) *Attorney, Agent, or Firm* — Lempia Summerfield Katz LLC

(57) ABSTRACT

A method for determining a spoiler gradient of a magnetic resonance (MR) system is provided. At least one shim parameter that defines a shim magnetic field for compensating for B0 magnetic field inhomogeneities in a measurement volume of the MR system is received. As a function of the at least one shim parameter, at least one spoiler parameter that defines a spoiler gradient for canceling out a transverse magnetization is determined. The spoiler gradient is applied together with the shim magnetic field in a measurement of the MR system.

15 Claims, 4 Drawing Sheets

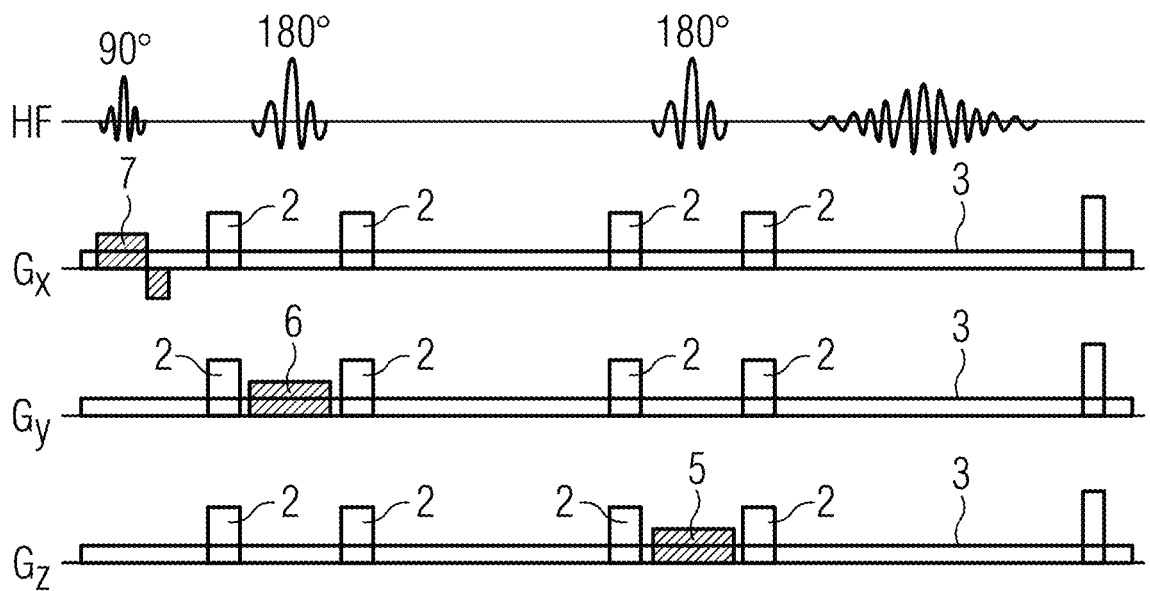

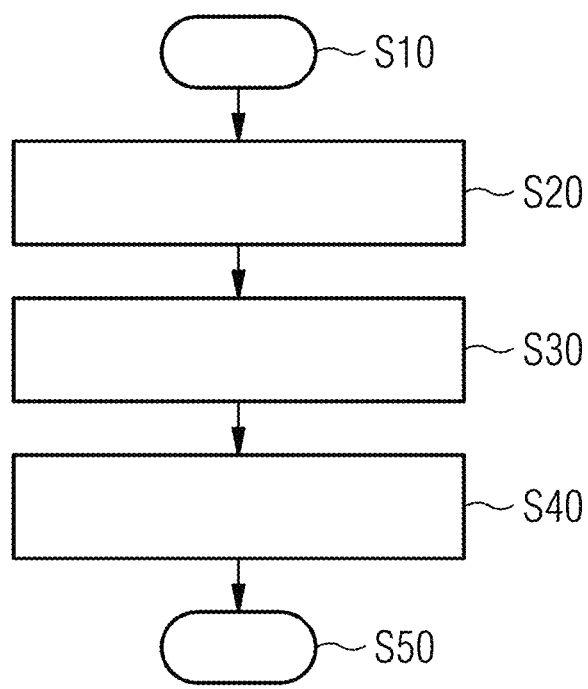

SHIM-DEPENDENT SPOILER GRADIENTS

This application claims the benefit of German Patent Application No. DE 10 2019 207 907.5, filed on May 29, 2019, which is hereby incorporated by reference in its entirety.

BACKGROUND

The present embodiments relate to determining spoiler gradients.

In magnetic resonance (MR) methods, such as MR imaging methods or those of localized spectroscopy, spoiler gradients are also used in addition to gradients for position selection in order to suppress undesired echoes, so that in the acquisition period of the data read-out, only one desired echo supplies a signal. If the undesired echoes are not successfully suppressed by these spoiler gradients, interference signals appear in the spectrum that make the evaluation partially or entirely impossible. In MR measurement sequences, it is therefore attempted to make the spoiler gradients sufficiently strong. In reality, in some cases, the possible spoiler gradients are insufficient, because relatively long spoiler gradients would preclude the necessary short echo times.

MR methods place high demands on the homogeneity of the main magnetic field B0. B0 field inhomogeneities may be compensated for by shim magnetic fields. For example, linear terms are generated via static offset currents of the three gradient coils, where, due to the linear field profile along the gradient direction, the term shim channels of the first order, or shim gradients, is used. MR systems may also have dedicated shim coils because, in the homogenization of the magnetic field in the measurement volume, additional gradients and, to some extent, also shim fields of a higher order are necessary in order to compensate, as far as possible, for inhomogeneities in the measurement volume. These shim fields are of particular significance in the vicinity of regions where there is a strong variation in susceptibility. As the main magnetic field becomes stronger, this effect also increases linearly.

In regions of the object that may contribute signals, the shim fields may compensate for the spoiler gradients partially or entirely, so that undesired signals are not suppressed and under certain circumstances may be detected.

SUMMARY AND DESCRIPTION

The scope of the present invention is defined solely by the appended claims and is not affected to any degree by the statements within this summary.

The present embodiments may obviate one or more of the drawbacks or limitations in the related art. For example, improved magnetic resonance (MR) techniques for the suppression of undesired signals, which overcome or mitigate at least some of these limitations and drawbacks, are provided.

Features, advantages and alternative exemplary embodiments may be applied in each case to the other categories and vice versa. In other words, the description and claims relating to the MR system may be improved by features described or claimed in connection with the methods. In this case, the functional features of the method may be executed by operating units of the MR system.

A method for determining a spoiler gradient of an MR system includes the following acts.

In one act, at least one shim parameter is received (e.g., read out from an MR system). The at least one shim parameter defines a shim magnetic field of an MR system for compensating for B0 magnetic field inhomogeneities in a measurement volume of the MR system.

In general, properties of a shim magnetic field (e.g., a shim gradient used to compensate for inhomogeneities in the B0 magnetic field in a measurement volume of the MR system) are defined by the at least one shim parameter. The shim parameters of the MR system for the shim magnetic field thus define the properties of the shim magnetic field and may be optimized during an adjustment. For example, the at least one shim parameter may determine a magnetic field strength, a spatial course of the magnetic field strength within the MR system, a sign or a trajectory of a gradient, an order of the shim magnetic field, or also a variation of the shim magnetic field over time. The shim magnetic field may be a shim gradient that may be formed along a particular spatial direction.

In a further act, as a function of the at least one shim parameter, at least one spoiler parameter that defines a spoiler gradient for the suppression of undesired signals from an examination object is determined (e.g., for canceling out a transverse magnetization in the examination object). In other words, a spoiler gradient is determined based on a shim magnetic field. For example, based on a property of the shim magnetic field that is defined by a shim parameter, a property of a spoiler gradient is determined as a function of the shim parameter. The property of the spoiler gradient is defined by a spoiler parameter. The at least one spoiler parameter is thus determined as a function of the at least one shim parameter such that a constructive overlay takes place between the shim magnetic field and the spoiler gradient.

In general terms, the at least one spoiler parameter may be determined as a function of the at least one shim magnetic field or, in other words, using the at least one shim parameter, based on the at least one shim parameter, and/or taking into account the at least one shim parameter, such that the polarity of the shim magnetic field and the polarity of the spoiler gradients match (e.g., such that the shim gradient and the spoiler gradient have the same polarity within the gradient system; have the same polarity at the same points in space). In this context, both magnetic fields, or gradients, may have a zero crossing at the center of the gradient system (e.g., have the value 0). Thus, the at least one shim parameter (e.g., a value of the at least one shim parameter) may be used or taken into account in order, on that basis, to determine (e.g., to calculate or using a pre-defined lookup table), to assign, or to define the at least one spoiler parameter (e.g., a value of the at least one spoiler parameter).

In general, the at least one shim parameter may be determined such that the shim magnetic field and the spoiler gradient have the same polarity or the same sign (e.g., by being overlaid or superimposed within the gradient system of the MR system, the shim magnetic field and the spoiler gradient amplify and constructively overlay one another).

In general, the at least one shim parameter may be determined or selected such that the shim magnetic field and the spoiler gradient have the same polarity (e.g., constructively overlay one another by being superimposed) inside and outside the measurement volume or field of view (FOV) (e.g., in all regions of the examination object in which undesired signals may be generated). Thus, undesired signals in all regions in the MR system are/may be suppressed effectively by the spoiler gradients.

In some examples, the at least one shim parameter may be determined such that a magnetic field strength of the spoiler gradient lies above a pre-defined threshold for a magnetic field strength that is necessary in order to cancel out the transverse magnetization. In this context, the pre-defined threshold for the magnetic field strength of the spoiler gradient is typical for an MR measurement sequence and is known to a person skilled in the art. Multiple shim magnetic fields may be overlaid in a region to be examined, where the spoiler gradient may be determined while taking into account multiple shim fields such that the spoiler gradient constructively overlays the resulting magnetic field (e.g., from the overlay).

In some embodiment variants, with the techniques of the present embodiments, the constructive overlay may be provided, for example, in a boundary region or a boundary of the measurement volume 4. Thus, the spoiler gradient may be determined such that an amplifying overlay of the at least one shim magnetic field and the spoiler gradient may be provided in all volumes to be examined in the examination object within and outside of the measurement volume, and/or in a volume directly adjoining the measurement volume, and/or in a boundary volume including the boundary of the measurement volume (e.g., which may extend to 100%, 50% or 20% of the measurement volume, and which may contribute signals to the measurement).

Initially, one shim magnetic field may be determined, where at least one shim parameter may be determined. Thereafter, as a function of the shim parameter, the spoiler gradient for an MR measurement sequence is defined (e.g., at least the spoiler parameter is determined as a function of the shim parameter). For example, a parameter of the spoiler gradient may be determined in this context such that in every case and/or at all points in the MR system or in a region to be examined, the spoiler gradient has the same polarity as the shim magnetic field. In accordance with the present embodiments, a parameter of the spoiler gradient (e.g., the sign or the trajectory) may be planned to be selected such that the parameter of the spoiler gradient corresponds to a parameter of the shim gradient. In other words, at least one parameter of the spoiler gradient is selected or determined such that an amplifying overlay takes place with the pre-determined shim field.

In a further act (e.g., while a measurement is being performed by the MR system), the spoiler gradient is applied or played out during an MR measurement sequence simultaneously (e.g., together) with the shim magnetic field in order to suppress undesired signals in the MR measurement.

In one embodiment, magnetic resonance signals are recorded in accordance with the MR measurement sequence. In one embodiment, MR images are reconstructed from the magnetic resonance signals recorded. The MR images may be stored in electronic form, for example, and/or displayed on a monitor.

Using the method of one or more of the present embodiments, undesired signals may be suppressed, and the spoiler gradients in the sequence need not be enlarged so as not to be compensated for by shim gradients. As a result, it is not necessary to switch over to a longer echo time or stronger gradients. Shorter echo times may be realized since the spoiler gradients may be applied with an optimal, and therefore minimum necessary, amplitude, and more accurate MR spectroscopy measurements and more reliable medical diagnoses in clinical applications are ultimately made possible as a result.

An MR system is configured to perform a method for determining a spoiler gradient. The MR system includes for this purpose an MR control unit and a memory unit, where the memory unit stores control information that may be executed by the MR control unit. The MR system is configured to perform the following acts when the control information is executed in the MR control unit.

In a first act, at least one shim parameter that defines a shim magnetic field for compensating for B0 magnetic field inhomogeneities in a measurement volume of the MR system is received. In a further act, as a function of the at least one shim parameter, at least one spoiler parameter that defines a spoiler gradient for canceling out a transverse magnetization is determined. In a further act, the spoiler gradient is applied together with the shim magnetic field in an MR measurement sequence.

The MR system may be further configured to carry out any other method or any combination of methods in accordance with the present disclosure.

A computer program, or computer program product (e.g., including a non-transitory computer-readable storage medium), that may be loaded directly into a memory of an MR control unit of an MR system includes commands that cause the MR control unit to perform the acts of any method in accordance with the present disclosure when the program is executed by a control unit of an MR system.

An electronically readable data storage medium (e.g., a non-transitory computer-readable storage medium) includes electronically readable control information (e.g., instructions) stored thereon. The electronically readable control information is configured to perform the acts of any method in accordance with the present disclosure when executed in an MR control unit of an MR system.

Technical effects may be achieved for such an MR system, a computer program, and an electronically readable data storage medium that correspond to the technical effects for the methods in accordance with the present disclosure.

Although the specific features described in the summary above and in the following detailed description have been described in connection with specific exemplary embodiments, the features may be used not just in the corresponding combinations but also in isolation, and features from different examples for the methods, MR systems, computer programs, and electronically readable data storage media may be combined together and correlate with one another unless explicitly specified otherwise.

The summary above should therefore provide merely a brief overview of some features of some embodiment variants and implementations and should not be understood as a restriction. Other embodiment variants may include features other than those described above.

BRIEF DESCRIPTION OF THE DRAWINGS

FIG. 2 shows schematically an MR measurement sequence and shim magnetic fields of an MR system in accordance with exemplary embodiments.

FIG. 3 shows schematically a user interface with shim parameters of an MR system in accordance with exemplary embodiments.

FIG. 5 shows a flow diagram including acts for determining a spoiler gradient of an MR system in accordance with exemplary embodiments.

DETAILED DESCRIPTION

Figure 1:
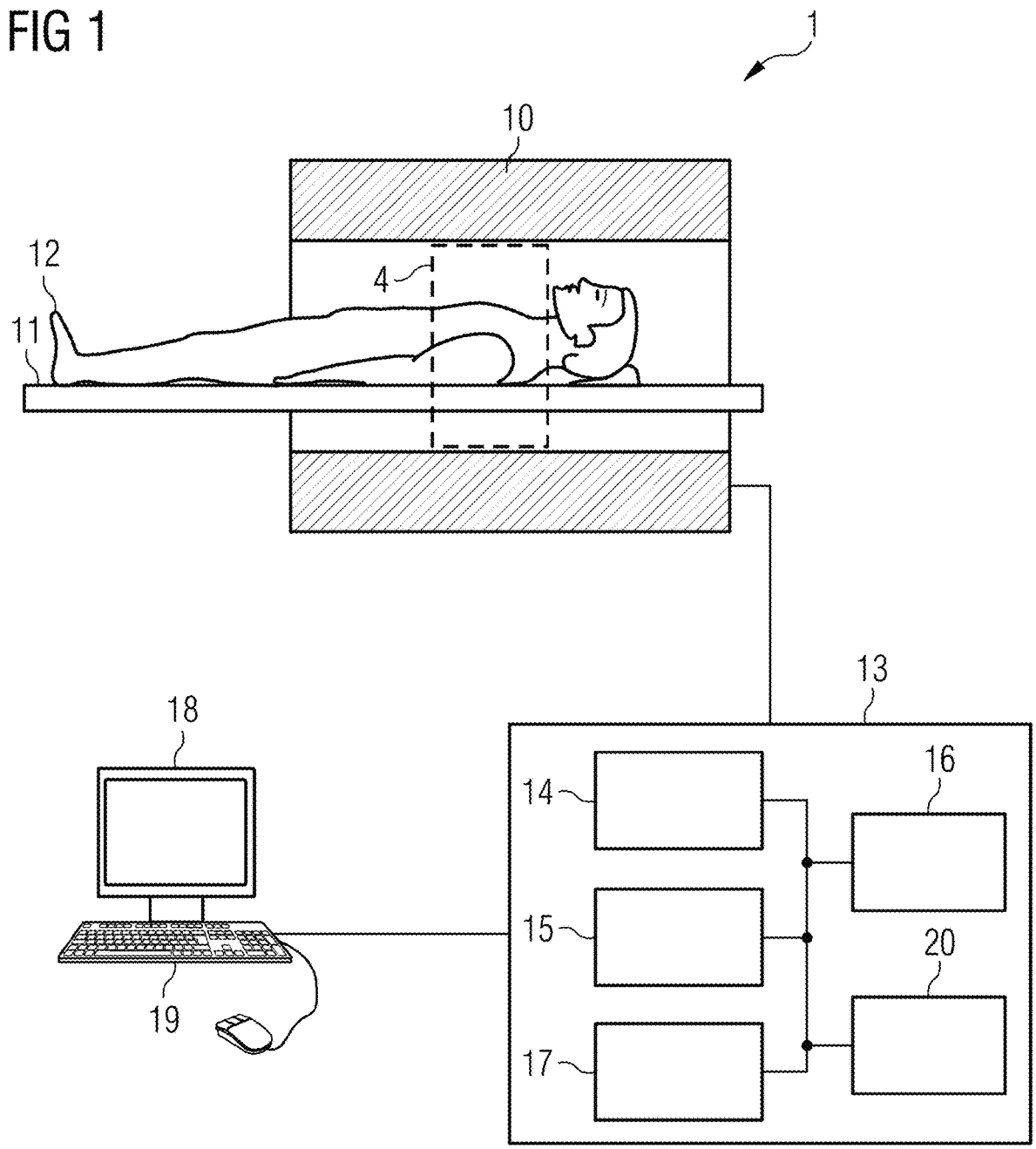
FIG. 1 shows schematically one embodiment of a magnetic resonance (MR) system with which a method for determining a spoiler gradient may be performed.

The aforementioned elements, features, steps, and concepts of the present disclosure will become apparent from the following detailed description of exemplary embodiments explained below with reference to the accompanying drawings.

The drawings should be regarded as schematic representations, and the elements depicted in the drawings are not necessarily shown to scale. Rather, the various elements are depicted in a way that makes function and general purpose apparent to a person skilled in the art. Each link or connection between function blocks, apparatuses, components, or other physical or functional units described in the drawings or herein may also be realized by an indirect link or connection. A connection between the components may also be established by a wireless link. Function blocks may be implemented as hardware, firmware, software, or a combination thereof.

Exemplary embodiments are described in detail below with reference to the accompanying drawings. The following description of the exemplary embodiments should not be understood in a narrow sense. The scope of the invention should not be restricted by the exemplary embodiments described below or by the drawings, which are provided merely for illustrative purposes.

Examples in the present disclosure relate to a magnetic resonance (MR) method for determining spoiler gradients on a shim-dependent basis (e.g., a method for determining the sign of a spoiler gradient as a function of the sign of a shim gradient).

The suppression of undesired signal portions plays an important role in MR spectroscopy and MR imaging. For example, signals from certain regions or certain spin species may need to be suppressed or canceled out. For example, in MR sequences having short repetition times, signal from a preceding excitation may often still be present, which may need to be canceled before the next excitation in the case of a T1-weighted contrast, for example. This may be achieved through a dephasing of spins, where special gradient pulses or high-frequency (HF) pulses may be used. For the suppression of signals, one or more HF excitation pulses may accordingly be used, with which the signal to be suppressed is selectively excited (e.g., a longitudinal magnetization is excited to transverse magnetization). Alternatively or in addition, one or more gradient pulses with which a transverse magnetization is dephased such that the transverse magnetization contributes a strongly reduced signal portion in the subsequent measurements, or none at all, may be used. This is also referred to as "gradient spoiling" or "spoiling".

In localized spectroscopy, for example, spoiler gradients are used in addition to the gradients for position selection in order to suppress undesired echoes, so that in the acquisition period of the data read-out, only the desired echo supplies a signal. If these spoiler gradients do not successfully suppress the undesired echoes, interference signals appear in the spectrum that make the evaluation partially or entirely impossible.

In MR measurement sequences, it is attempted to make the spoiler gradients sufficiently strong. In reality, the possible spoiler gradients may be insufficient, because relatively long spoiler gradients would preclude making the necessary short echo times possible.

In general terms, a magnet of the MR system provides a DC magnetic field, which may be referred to as a B0 magnetic field, B0 field, or main magnetic field B0, and which may have a low field strength close to 0 or a high strength of up to 20 tesla (T) or more, along a longitudinal axis. The B0 field aligns the magnetization of spins of an object to be examined along the direction of the B0 field (e.g., along the longitudinal axis). For many MRT applications, the homogeneity of the magnetic B0 field in a measurement volume from which MR measured signals are obtained is critical to the quality of the MR measurement.

MR methods, such as MR imaging methods or spectroscopy applications, place high demands on the homogeneity of the main or polarization field B0. For example, the individual body of each patient as well as other movable apparatuses within the MR system 1 deform the local B0 field. In order to be able to apply the aforementioned methods, however, shimming is carried out. With conventional methods, the local B0 field in the examination region is firstly measured to create a B0 map, and based on the B0 map, DC offset currents for the three gradient coils for generating shim gradients, currents for shim magnetic fields of a higher order, and currents for special shim coils are then calculated, such that the local field distortions within the measurement volume 4 are compensated for in the best way possible. A shim field may be applied permanently, where one or more spoiler gradients may be played out or actuated within an MR measurement sequence.

The precision with which the local B0 field inhomogeneities are compensated for depends on the number and order of the shim channels. In MR system 1, the linear terms x, y and z are generated, for example, via static offset currents of the three gradient coils. Due to the linear field profile along the gradient direction, the term shim channels of the first order, or shim gradients, is also used. The MR system 1 may also have dedicated shim coils. In the homogenization of the magnetic field in the measurement volume 4, additional gradients and to some extent also shim fields of a higher order are necessary in order to compensate for inhomogeneities in the measurement volume 4. These shim fields are of particular significance in the vicinity of regions where there is a strong variation in susceptibility. As the main magnetic field becomes stronger, this effect also increases linearly.

In summary, in order to compensate for an inhomogeneity in the B0 field, shim magnetic fields that may be generated by shim coils that may be contained in a gradient coil or local coils are applied. In order to achieve optimum results, the current through the shim coils is optimized so that the B0 field in the measurement volume is as homogeneous as possible. These shim magnetic fields therefore bring about a homogenization of the B0 field within the measurement volume, but act on the whole examination object. In this context, a shim magnetic field may be static or may be varied over time during a measurement sequence. The shim magnetic field may be applied permanently and independently of the measurement sequence.

In regions of the object outside of the measurement volume 4 that may contribute signals to the measurement, for example, these shim magnetic fields 3 may compensate for the spoiler gradients partially or entirely (e.g., by overlay, superimposition), so that the undesired signals in these regions are not suppressed and are thus detected.

In general, examples of the present disclosure provide for a large number of circuits, data storage units, interfaces, or electrical processing apparatuses (e.g., processors). All references to these units and other electrical devices and the functions provided by them are not restricted to what has been shown and described. Although certain designations may be assigned to the various circuits or other electrical devices disclosed, these designations are not intended to restrict the functional scope of the circuits and other electrical devices. These circuits and other electrical devices may be combined with one another and/or separated from one another depending on the type of electrical implementation that is desired. Any circuit or other electrical apparatus disclosed herein may include any number of microcontrollers, a graphics processing unit (GPU), integrated circuits, memory apparatuses (e.g., FLASH, random-access memory (RAM), read-only memory (ROM), erasable programmable read-only memory (EPROM), electrically erasable programmable read-only memory (EEPROM), or other suitable embodiment variants thereof), as well as pieces of software that interact with each other, to carry out the method acts disclosed. Each of the electrical apparatuses may be configured to execute program code that is stored in a computer-readable data storage medium (e.g., a non-transitory computer-readable storage medium) and configured to carry out any number of acts in accordance with the methods of the present disclosure.

FIG. 1 shows schematically an MR system 1 with which a method for determining a spoiler gradient 2 may be performed in accordance with the present embodiments.

A person 12 under examination, or more generally an examination object, is moved into the tunnel of the system 1. The magnetic resonance system 1 has a magnet 10 for generating a main field B0, where a person 12 under examination arranged on a couch 11 is moved into the center of the magnet in order to acquire there, from a measurement volume 4, spatially encoded magnetic resonance signals. The application of high-frequency pulses and the switching of magnetic field gradients may disrupt the magnetization produced by the main field B0 by deflecting the nuclear spins out of the equilibrium position, and the currents induced in receive coils during the return to the equilibrium position may be converted into magnetic resonance signals. Since a person skilled in the art knows in general how MR images are produced using shim coils and spoiler gradients 2, and how magnetic resonance signals are detected, this is not explained in greater detail.

The magnetic resonance system 1 also has an MR control unit 13 that is used to control the MR device. The central MR control unit 13, which is configured to perform the method described below for determining on a shim-dependent basis the signs of spoiler gradients 2, has a gradient controller 14 for controlling and switching the magnetic field gradients and spoiler gradients 2, and an HF controller 15 for controlling and emitting the HF pulses for deflecting the nuclear spins from the equilibrium position. The imaging sequences needed for acquiring the MR images and all the programs needed to operate the MR system 1, for example, may be stored in a memory unit 16. An acquisition unit 17 controls the image acquisition and thus controls, based on the selected imaging sequences, the sequence of the magnetic field gradients and HF pulses and the intervals for receiving MR signals. The acquisition unit 17 thus also controls the gradient controller 14 and the HF controller 15 (e.g., the amplitude and the signs of spoiler gradients 2 in the MR measurement sequence). MR images, which may be displayed on a display 18, may be computed in a processing unit 20 (e.g., a processor), where an operator may operate the MR system 1 via an input unit 19. The memory unit 16 may include MR measurement sequences and program modules, which when executed in the processing unit 20 by one of the modules shown, perform the method according to the present embodiments. The MR control unit 13 may also be configured to improve a determination of the signs of spoiler gradients 2 based on shim fields 3 (e.g., the signs of the shim fields 3), as explained in detail below.

For example, the memory unit 16 stores for this purpose control information that may be executed by the MR control unit 13. The acquisition unit 17 is configured to carry out the determination of spoiler gradients 2 described below. Therefore, the MR system 1 of FIG. 1 is configured to carry out a method for determining on a shim-dependent basis spoiler gradients 2 in accordance with the present embodiments.

In general, receiving shim parameters may include receiving stored shim parameters from an internal or external memory of a computer or an MR system 1, and/or transferring or shim parameters from an MR system 1 or another computing apparatus, where in general, any type of sending and receiving data may be implemented.

In some examples, instead of the at least one shim parameter being received, the at least one shim parameter may be read out from settings of an MR system. In this context, the at least one shim parameter (e.g., a value of the shim parameter or a sign of the shim magnetic field) may be determined.

In general, the term parameter refers to parameters of an MR system 1 (e.g., settings, or values for settings, of an MR system 1) that cause the MR system 1 to embody a certain functionality (e.g., shim magnetic fields 3 and spoiler gradients 2 with certain properties).

In accordance with the present embodiments, the polarity of the spoiler gradients 2 is selected such that the effect of spoiler gradients 2 applied by magnetic fields required in order to shim the B0 field within the measurement volume 4 is not diminished, and on the contrary, is amplified.

In some examples, in order to select the correct sign of the spoiler gradients 2, an item of information about signs of shim gradients in the sequence may be known, and the spoiler gradients 2 may be played out accordingly. With this procedure, the undesired signals may be suppressed, and the spoiler gradients 2 in the sequence need not be enlarged so as not to be compensated for by shim gradients. As a result, it is not necessary to switch over to a longer echo time or stronger gradients.

In accordance with the present embodiments, signs of the spoiler gradients 2 are controlled such that sufficient suppression of undesired signals is enabled without needing to make the spoiler gradients 2 stronger and thereby causing the potentially ensuing disadvantages. Ultimately, shorter echo times may be realized since the spoiler gradients 2 may be applied with an optimal, and therefore minimum necessary, amplitude.

FIG. 2 shows schematically an MR measurement sequence and shim magnetic fields 3 of an MR system 1 in accordance with exemplary embodiments.

A spectroscopy sequence (e.g., a single-voxel PRESS sequence) is shown in FIG. 2, with the time axis extending from left to right. The magnetic field gradients Gx 7, Gy 6, and Gz 5 are magnetic field gradients for the volume selection in the three spatial directions (e.g., coordinate axes of the MR system 1). The spoiler gradients 2 along each of the coordinate axes each have a positive sign. Also shown in FIG. 2 are shim magnetic fields 3 of the MR system 1 in each of the three spatial directions x, y, and z. The shim magnetic fields are usually applied permanently and independently of the measurement sequence, but these may vary over time in some examples, where the shim parameters are determined according to the variation over time.

FIG. 3 shows schematically a user interface for setting shim parameters 8 of an MR system 1, which may be determined by adjustments, in accordance with exemplary embodiments.

A user interface for manual shimming is shown by way of example in FIG. 3. The current shim parameters 8 for the shim magnetic fields 3 are shown. In this example, the x shim gradient has a negative sign, whereas the y and z shim gradients have positive signs.

Figure 4:
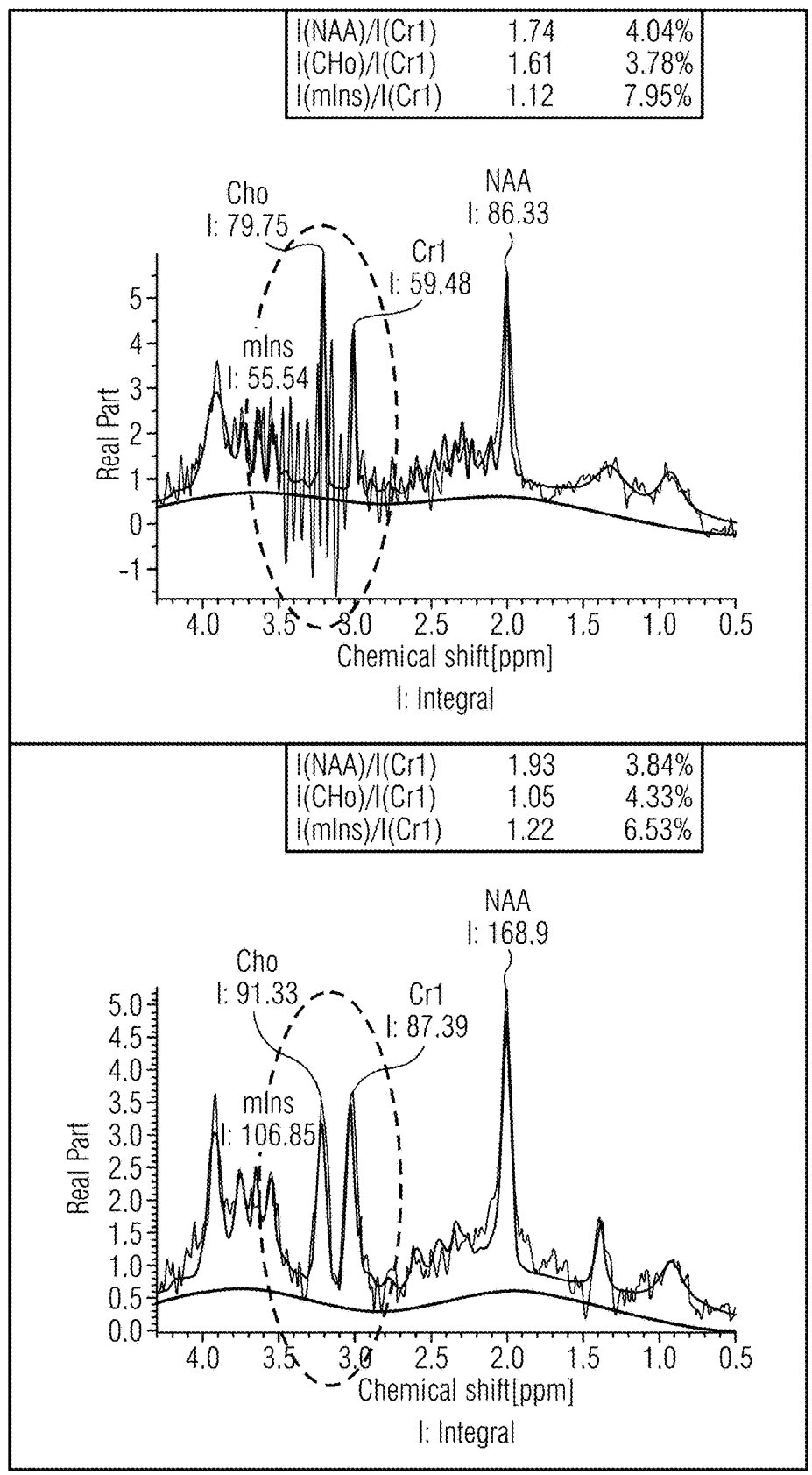
FIG. 4 shows a comparison of measurement results of a conventional MR method (top) with measurement results of an MR method in accordance with the present embodiments (bottom).

FIG. 4 shows a comparison of measurement results of a conventional MR method (in the upper diagram) with measurement results of an MR method in accordance with the present embodiments (in the lower diagram).

Elimination of the undesired echo is shown in FIG. 4. The upper diagram shows a regular MR measurement, where the signal of the undesired echo is marked with an ellipse. The lower diagram shows a measurement in accordance with the present embodiments at the same voxel position with spoiler gradient signs in accordance with the present embodiments. As shown highlighted with an ellipse, the undesired signal is not detected.

FIG. 5 shows a flow diagram containing acts for determining a spoiler gradient 2 of an MR system 1 in accordance with exemplary embodiments.

The method starts at act S10. In act S20, at least one shim parameter that defines a shim magnetic field 3 for compensating for B0 magnetic field inhomogeneities in a measurement volume 4 of the MR system 1 is received. In act S30, as a function of the at least one shim parameter, at least one spoiler parameter that defines a spoiler gradient 2 for canceling out a transverse magnetization is determined. In act S40, the spoiler gradient 2 is applied together with the shim magnetic field 3 in an MR measurement sequence. The method ends in act S50.

Some general conclusions may be drawn from the statements made above.

The shim magnetic field 3 and the spoiler gradient 2 may be gradients in, or along, the same spatial direction (e.g., may be applied, or varied, along the same spatial direction). In this context, the magnetic fields 2, 3 may be determined such that the respective magnetic field 2, 3 has the same sign (e.g., the same trajectory in a linear gradient system) and thus the same polarity at the same points or coordinates along the spatial direction.

The shim magnetic field 3 may be a shim gradient. The spatial direction may be the x coordinate axis, the y coordinate axis, or the z coordinate axis of a coordinate system of the MR system 1. The shim magnetic field 3 may, therefore, be a shim gradient along one of the axes of the coordinate system of the MR system 1 (e.g., a shim gradient in the x direction, a shim gradient in the y direction, or a shim gradient in the z direction).

Accordingly, the spoiler gradient 2 may, therefore, be a spoiler gradient 2 along one of the axes of the coordinate system of the MR system 1 (e.g., a spoiler gradient 2 in the x direction, a spoiler gradient 2 in the y direction, or a spoiler gradient 2 in the z direction).

The magnetic field gradients 2, 3 may be applied in any spatial direction corresponding to any combination of x, y and z directions or magnetic field components. In this context, the x, y and z directions are typically spatial directions orthogonal to one another.

A coordinate system of the MR system 1 may include an x axis, a y axis, and a z axis, within which measurement volumes of an examination object, the alignment and shape of which may vary according to the application, are excited. In some examples, the measurement volumes may have any orientations in space. The z coordinate axis of the MR system 1 may correspond to the patient axis, axis of movement of the patient table, or longitudinal axis of the tunnel (e.g., patient tunnel).

The at least one shim parameter may be a sign of the shim gradient 2. The at least one spoiler parameter may be a sign of the spoiler gradient 2.

Shim magnetic fields 3 (e.g., shim gradients) and spoiler gradients 2 may be applied or played out with a certain trajectory. A sign of a gradient describes the trajectory (e.g., rising (positive sign) or falling (negative sign) along a spatial direction) of the gradient (e.g., of the linear change in the magnetic field strength). In this context, the magnetic field gradient shares a zero crossing in the middle of the magnet (e.g., in the middle of the gradient system; in the isocenter). Consequently, the sign of the gradient determines the trajectory of the gradient, and consequently also the polarity of the gradient. In other words, the shim gradient 3 and the spoiler gradient 2 may both have a positive sign or a negative sign, where the shim gradient 3 and the spoiler gradient 2 have the same (e.g., a positive or a negative) polarity at all points along a common spatial direction. As a result, the polarity of the gradient fields (e.g., of the shim gradient 3 and spoiler gradient 2) may be the same within the MR system 1 (e.g., along the spatial direction). For example, the sign of the spoiler gradient 2 may be determined such that the sign of the spoiler gradient 2 corresponds to the sign of the shim magnetic field 3.

In some examples, multiple spoiler gradients 2 are played out in a spatial direction, where the multiple spoiler gradients 2 have the same sign as the shim gradient 3.

In some examples, the at least one shim parameter may include a change in the shim magnetic field 3 over time during an MR measurement of the MR system 1 (e.g., may vary over time or may define the variation over time). The at least one spoiler parameter may include a change in the spoiler gradient 2 over time during an MR measurement of the MR system 1 (e.g., may vary over time or may define the variation over time). The at least one shim parameter may include or define a spatial course of the shim magnetic field 3 in the MR system 1. The at least one spoiler parameter may include or define a spatial course, defined by signs and/or strength and/or trajectory of the spoiler gradient 2 in the MR system 1.

The at least one parameter of the spoiler gradient 2 may be determined as a function of the shim magnetic field 3 (e.g., using the at least one shim parameter), such that an amplifying (e.g., positive) or constructive overlay of the shim magnetic field 3 and spoiler gradient 2 is produced in the measurement volume 4, and the undesired signals from these regions may be suppressed in full by the spoiler gradient 2 as a result.

In some examples, the sign of the spoiler gradient 2 in a spatial direction of the MR system 1 may be determined in the same spatial direction as a function of the sign of the shim gradient 3 such that the sign of the spoiler gradient 2 and the sign of the shim gradient 3 in the spatial direction are the same. As a result, the shim gradient 3 and the spoiler gradient 2 have the same polarity (e.g., at each point within the gradient system), such that the shim gradient 3 and the spoiler gradient 2 constructively overlay one another (e.g., the spoiler gradient 2 is not attenuated by the shim gradient).

For example, spoiler parameters (e.g., the sign of a spoiler gradient 2) may be determined as a function of a plurality of shim magnetic fields 3 overlaying one another. In this context, in accordance with the method described above, the shim parameters 3 overlaying one another (e.g., the sign of the shim magnetic field 3 or of the magnetic field resulting from the overlay) may be used.

In summary, a method for determining on a shim-dependent basis a spoiler gradient of an MR system is provided. Based on the sign of a shim gradient in a spatial direction, the sign of a spoiler gradient in the same spatial direction is determined such that both gradients have the same sign and thus the same polarity within the gradient system.

In accordance with the present embodiments, a spoiler gradient is determined such that sufficient suppression of undesired signals from the examination object is enabled without needing to make the spoiler gradient stronger and thereby causing the potentially ensuing disadvantages. Ultimately, shorter echo times may be realized since the spoiler gradients may be applied with an optimal, and therefore minimum necessary, amplitude.

Although the invention has been illustrated and described with reference to exemplary embodiments, equivalents and modifications may be carried out by a person skilled in the art after reading and understanding the description. The present invention encompasses all such equivalents and modifications and is restricted only by the scope of the appended claims.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a spoiler gradient of a magnetic resonance (MR) system, the method comprising:
    receiving a value of at least one shim parameter that defines a shim magnetic field for compensating for B0 magnetic field inhomogeneities in a measurement volume of the MR system;
    determining a value of at least one spoiler parameter that defines a spoiler gradient for canceling out a transverse magnetization, as a function of the value of the at least one shim parameter, to minimize echo times and spoiler gradient strengths, such that the value of the at least one spoiler parameter is controllable based on the value of the at least one shim parameter; and
    applying the spoiler gradient in an MR measurement sequence of the MR system,
    wherein a polarity of the spoiler gradient is selectable to match a polarity of the shim magnetic field inside and outside the measurement volume of the MR system, such that applying the spoiler gradient amplifies the shim magnetic field.

2. The method of claim 1, wherein the shim magnetic field is a shim gradient.

3. The method of claim 1, wherein the shim magnetic field and the spoiler gradient are gradients in a same spatial direction.

4. The method of claim 2, wherein the at least one shim parameter comprises a sign of the shim gradient, and
    wherein the at least one spoiler parameter comprises a sign of the spoiler gradient.

5. The method of claim 4, wherein the sign of the spoiler gradient in a spatial direction of the MR system is determinable in the spatial direction as a function of the sign of the shim magnetic field, such that the sign of the spoiler gradient and the sign of the shim magnetic field in the spatial direction are the same.

6. The method of claim 1, wherein the shim magnetic field is varied over time during the MR measurement sequence, and the at least one shim parameter is determined according to the variation of the shim magnetic field over time.

7. The method of claim 1, wherein the at least one spoiler parameter is determined as a function of the at least one shim parameter, such that the shim magnetic field and the spoiler gradient constructively overlay one another in the MR system.

8. A magnetic resonance (MR) system configured to determine a spoiler gradient, the MR system comprising:
    an MR control unit; and
    a memory unit,
    wherein the memory unit is configured to store control information that is executable by the MR control unit, and
    wherein when the control information is executed in the MR control unit, the MR system is configured to:
        receive a value of at least one shim parameter that defines a shim magnetic field for compensating for B0 magnetic field inhomogeneities in a measurement volume of the MR system;
        determine a value of at least one spoiler parameter that defines a spoiler gradient for canceling out a transverse magnetization, as a function of the value of the at least one shim parameter, to minimize echo times and spoiler gradient strengths, such that the value of the at least one spoiler parameter is controllable based on the value of the at least one shim parameter; and
        apply the spoiler gradient in a measurement of the MR system,
        wherein a polarity of the spoiler gradient is selectable to match a polarity of the shim magnetic field inside and outside the measurement volume of the MR system, such that application of the spoiler gradient amplifies the shim magnetic field.

9. The MR system of claim 8, wherein the shim magnetic field is a shim gradient.

10. The MR system of claim 8, wherein the shim magnetic field and the spoiler gradient are gradients in a same spatial direction.

11. The MR system of claim 9, wherein the at least one shim parameter comprises a sign of the shim gradient, and
    wherein the at least one spoiler parameter comprises a sign of the spoiler gradient.

12. The MR system of claim 11, wherein the sign of the spoiler gradient in a spatial direction of the MR system is determinable in the spatial direction as a function of the sign of the shim magnetic field, such that the sign of the spoiler gradient and the sign of the shim magnetic field in the spatial direction are the same.

13. The MR system of claim 8, wherein the shim magnetic field is varied over time during the MR measurement sequence, and the at least one shim parameter is determined according to the variation of the shim magnetic field over time.

14. The MR system of claim 8, wherein the at least one spoiler parameter is determined as a function of the at least one shim parameter, such that the shim magnetic field and the spoiler gradient constructively overlay one another in the MR system.

15. In a non-transitory computer-readable storage medium that stores instructions executable by a controller of a magnetic resonance (MR) system to determine a spoiler gradient of a magnetic resonance (MR) system, the instructions comprising:
- receiving a value of at least one shim parameter that defines a shim magnetic field for compensating for B0 magnetic field inhomogeneities in a measurement volume of the MR system;
- determining a value of at least one spoiler parameter that defines a spoiler gradient for canceling out a transverse magnetization, as a function of the at least one shim parameter, to minimize echo times and spoiler gradient strengths, such that the value of the at least one spoiler parameter is controllable based on the value of the at least one shim parameter; and
- applying the spoiler gradient in an MR measurement sequence of the MR system,
- wherein a polarity of the spoiler gradient is selectable to match a polarity of the shim magnetic field inside and outside the measurement volume of the MR system, such that applying the spoiler gradient amplifies the shim magnetic field.

* * * * *